(12) United States Patent
Miyazawa et al.

(10) Patent No.: US 7,477,221 B2
(45) Date of Patent: Jan. 13, 2009

(54) DISPLAY DEVICE

(75) Inventors: Toshio Miyazawa, Chiba (JP);
Kazutaka Goto, Mobara (JP); Atsushi Hasegawa, Togane (JP)

(73) Assignee: Hitachi Displays, Ltd., Chiba (JP)

( * ) Notice: Subject to any disclaimer, the term of this patent is extended or adjusted under 35 U.S.C. 154(b) by 701 days.

(21) Appl. No.: 11/134,381

(22) Filed: May 23, 2005

(65) Prior Publication Data

US 2005/0285113 A1    Dec. 29, 2005

(30) Foreign Application Priority Data

Jun. 23, 2004    (JP)  ............................. 2004-184335

(51) Int. Cl.
*G09G 3/36*    (2006.01)
(52) U.S. Cl. ............................. 345/87; 345/89; 345/90; 345/92; 345/95; 345/204
(58) Field of Classification Search .................... 345/89, 345/204–211, 690–693, 8
See application file for complete search history.

(56) References Cited

U.S. PATENT DOCUMENTS

| | | | |
|---|---|---|---|
| 5,410,349 A * | 4/1995 | Tanigawa et al. ............. | 348/311 |
| 6,316,977 B1 * | 11/2001 | Sargeant ...................... | 327/157 |
| 6,801,194 B2 | 10/2004 | Miyazawa et al. | |
| 6,891,411 B2 * | 5/2005 | Lever .......................... | 327/148 |
| 6,909,414 B2 * | 6/2005 | Tsuchi et al. .................. | 345/89 |
| 6,992,915 B2 * | 1/2006 | Kang et al. ................... | 365/154 |

* cited by examiner

*Primary Examiner*—My-Chau T. Tran
*Assistant Examiner*—Jennifer T Nguyen
(74) *Attorney, Agent, or Firm*—Reed Smith LLP; Stanley P. Fisher, Esq.; Juan Carlos A. Marquez

(57) ABSTRACT

The present invention provides a display device which can achieve the high breakdown voltage proof property, the enhancement of reliability or the expansion of the designing/process tolerance of transistors by the improvement of a circuit. A display device includes a plurality of pixels and a drive circuit which drives the plurality of pixels. The drive circuit includes a p-type first transistor which has a first electrode thereof connected to a first power source line to which a reference voltage V1 is applied, a p-type second transistor which has a first electrode thereof connected to a second electrode of the first transistor and a second electrode thereof connected to an output terminal thereof, an n-type third transistor which has a first electrode thereof connected to a second power source line to which a reference voltage V2 is applied, and an n-type fourth transistor which has a first electrode thereof connected to a second electrode of the third transistor and a second electrode thereof connected to an output terminal thereof. A first bias voltage Vcp is applied to a control electrode of the second transistor and a second bias voltage Vcn is applied to a control electrode of the fourth transistor. Further, a relationship V2<Vcp<V1 and a relationship V2<Vcn<V1 are satisfied.

9 Claims, 7 Drawing Sheets

DISPLAY DEVICE

The present application claims priority from Japanese application JP2004-184335 filed on Jun. 23, 2004, the content of which is hereby incorporated by reference into this application.

BACKGROUND OF THE INVENTION

The present invention relates to a display device, and more particularly to a technique which is effectively applicable to an active-matrix type display device which forms a display drive circuit on a substrate surface thereof.

For example, an active-matrix type display device which uses thin film transistors (TFT) as active elements includes pixel regions on a liquid-crystal-side surface of one substrate out of a pair of substrates which are arranged to face each other with liquid crystal therebetween, wherein the pixel regions are surrounded by gate lines which extend in the x direction and are arranged in parallel in the y direction and drain lines which extend in the y direction and are arranged in parallel in the x direction.

The pixel region includes the thin film transistor (TFT) which is operated in response to the supply of a scanning signal from the gate line and a pixel electrode to which a video signal from the drain line is supplied by way of the thin film transistor.

The pixel electrode, for example, generates an electric field between the pixel electrode and a counter electrode which is formed on another substrate side so as to control the optical transmissivity of the liquid crystal between these electrodes with the electric field.

The liquid crystal display device includes a scanning signal drive circuit which supplies a scanning signal to respective gate signal lines and a video signal drive circuit which supplies a video signal to respective drain signal lines, wherein these drive circuits include shift registers.

There has been also known a polysilicon-type liquid crystal display device in which a semiconductor layer of the thin film transistor which constitutes the above-mentioned active element is made of polycrystalline silicon (polysilicon; p-Si).

In such a polysilicon-type liquid crystal display device, thin film transistors (for example, MIS transistors) which constitute the scanning signal drive circuit and the video signal drive circuit are also formed on a surface of the above-mentioned one substrate surface together with the thin film transistors constituting the thin film transistors using the same step.

There may be a case that polysilicon-type liquid crystal display device includes a high voltage for performing the inversion driving of the liquid crystal.

In general, the thin film transistor which uses the polysilicon as the material of the semiconductor layer forms a gate film by a deposition method and hence, a gate dielectric strength is basically low and is liable to be easily deteriorated by a penetration current whereby the thin film transistor is not suitable for the high-voltage application.

Although it is expected that the recrystallization technique for forming the polysilicon will be enhanced hereafter, there exists a possibility that the high voltage processing will become difficult along with the demand for higher performance.

On the other hand, in the field of the semiconductors, as a technique for enhancing the dielectric strength characteristics of the transistors, the LDD structure and the double gate structure have been known.

SUMMARY OF THE INVENTION

The above-mentioned LDD structure is provided for enhancing a drain-source breakdown voltage (BVds) proof property such as a short-channel effect or the like by lowering the source-drain (so-called diffusion layer) impurity concentration of the periphery of the gate.

However, the LDD structure is basically equivalent to the addition of resistances to an end portion of the gate and hence, the LDD structure becomes an obstacle for acquisition of higher performance.

Further, the double gate structure can enhance drain-source breakdown voltage (BVds) proof property such as a short-channel effect or the like and can reduce a leak current.

Although the double gate structure can enhance the BVds level, there may be a case that the enhancement of the BVds level is not sufficient.

The present invention has been made to overcome the above-mentioned drawbacks of the related art and it is an object of the present invention to provide a technique which can realize the high transistor breakdown proof property by an improvement of a circuit thus enhancing the reliability or the enlargement of the tolerance of design and process in a display device.

The above-mentioned and other objects of the present invention and novel features of the present invention will become apparent based on the description of this specification and attached drawings.

To briefly explain the summary of typical inventions out of the inventions disclosed in this specification, they are as follows.

To achieve the above-mentioned object, the display device according to the present invention includes a plurality of pixels and a drive circuits which drives the plurality of pixels, wherein the drive circuit includes a first transistor which has a first electrode thereof connected to a power source line to which a reference voltage of V1 is applied and a second transistor which has a first electrode thereof connected to a second electrode of the first transistor and allows a bias voltage of Vc to be applied to a control electrode thereof, wherein when the first transistor assumes an OFF state, assuming a voltage applied to a second electrode of the second transistor as V2, a relationship V2<Vc<V1 (or V1<Vc<V2) is satisfied.

In one embodiment of the present invention, the relationship $0.9 \times (V1-V2)/2 \leq Vc \leq 1.1 \times (V1-V2)/2$, (or the relationship $0.9 \times (V2-V1)/2 \leq Vc \leq 1.1 (V2-V1)/2$) is established.

To briefly explain the advantageous effects obtained by the typical inventions among the inventions disclosed in this application, they are as follows.

According to the display device of the present invention, it is possible to realize the transistor breakdown voltage proof property due to the improvement of circuit whereby the reliability is enhanced and the tolerance of designing and process can be enhanced.

DESCRIPTION OF THE PREFERRED EMBODIMENTS

Hereinafter, an embodiment of the present invention is explained in conjunction with attached drawings.

Here, in all drawings which are provided for explaining the embodiment, parts having identical functions are given same symbols and their repeated explanation is omitted.

Figure 8:
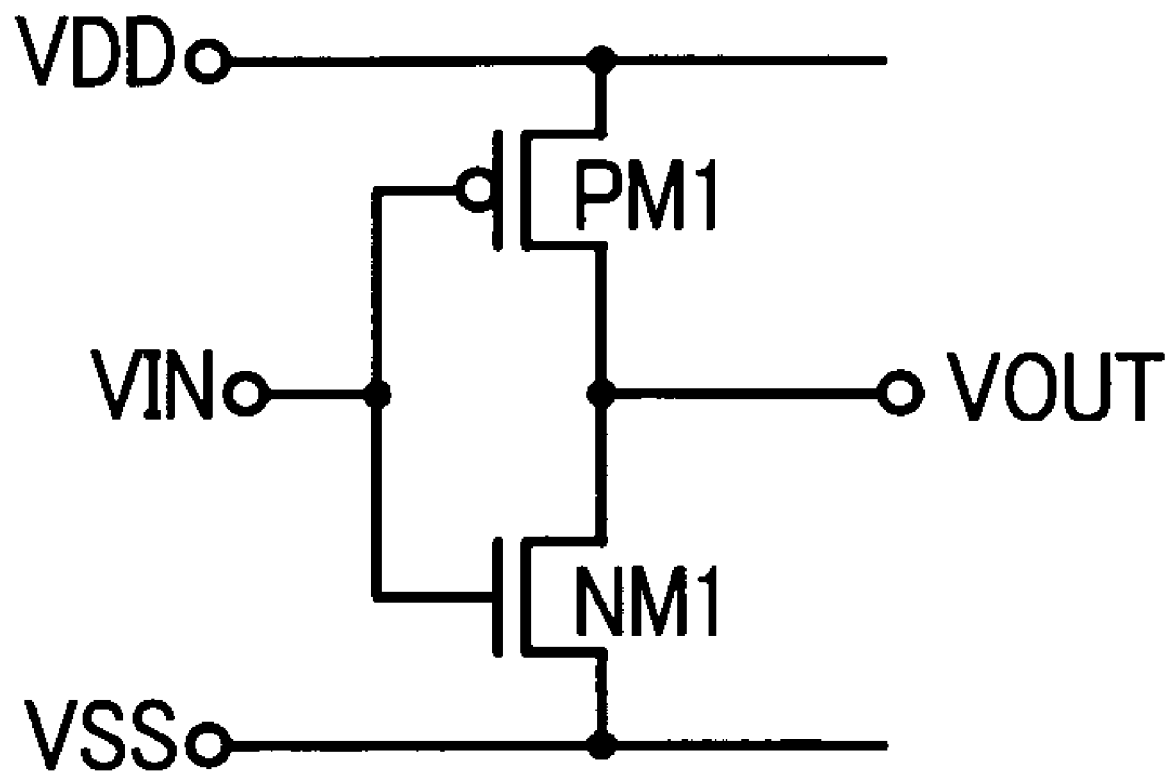
FIG. 8 is a circuit diagram showing a conventional CMOS inverter.

FIG. 8 is a circuit diagram showing a conventional CMOS inverter.

As shown in FIG. 8, in the conventional CMOS transistor, a p-type MOS transistor (hereinafter simply referred to as PMOS) (PM1) and an n-type MOS transistor (hereinafter simply referred to as NMOS) (NM1) are connected in series between a first power source voltage (VDD) and a second power source voltage (VSS).

A gate of the PMOS (PM1) and a gate of the NMOS (NM1) are connected in common thus forming an input terminal (VIN) for a signal, while a connection point between a drain of the PMOS (PM1) and a drain of the NMOS (NM1) forms an output terminal (VOUT) of the signal.

Figure 1:
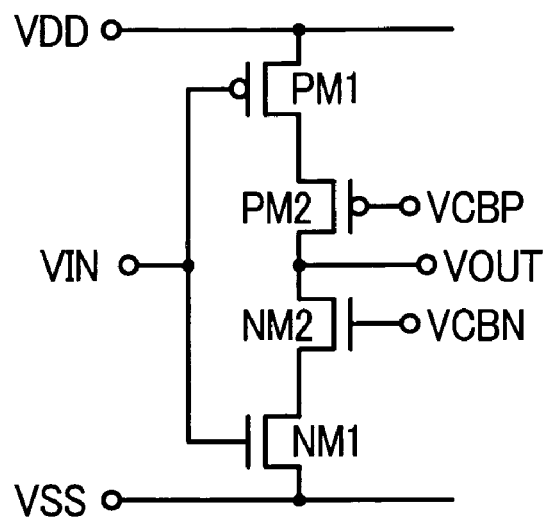
FIG. 1 is a circuit diagram showing a CMOS inverter to which the present invention is applied.

FIG. 1 is a circuit diagram showing the CMOS inverter to which the present invention is applied.

The CMOS inverter shown in FIG. 1 differs from the inverter shown in FIG. 8 with respect to a point that a second PMOS (PM2) is connected between the PMOS (PM1) and the output terminal (VOUT), and that a second NMOS (NM2) is connected between the NMOS (NM1) and the output terminal (VOUT).

Figure 2:
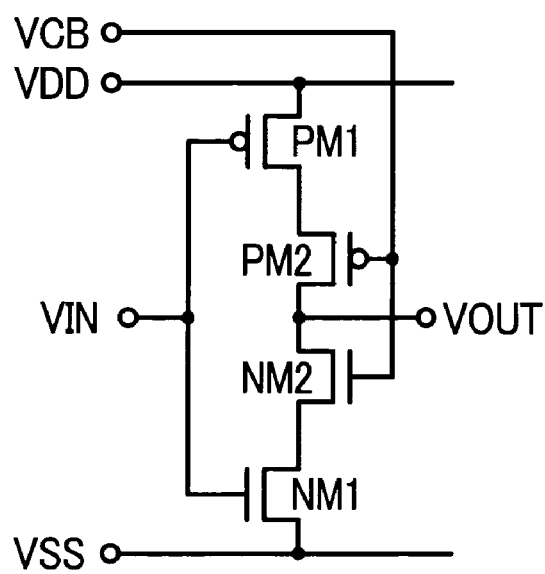
FIG. 2 is a circuit diagram showing another example of a bias voltage applying method in the CMOS inverter shown in FIG. 1.

Here, as shown in FIG. 1, a fixed bias voltage (VCBP) is applied to the gate of the PMOS (PM2), a fixed bias voltage (VCBN) is applied to the gate of the NMOS (NM2), or, as shown in FIG. 2, the same fixed bias voltage (VCB) is applied to the gate of the PMOS (PM2) and the gate of the NMOS (MN2).

These fixed bias voltages VCBP, VCBN, VCB are voltages which are set lower than the first power source voltage (VDD) and higher than the second power source voltage (VSS) (that is, VSS<VCBP<VDD, VSS<VCBN<VDD, VSS<VCB<VDD) or a pulse described later.

In FIG. 2, here considered is the case in which the voltages VSS, VCB and VIN are set such that VSS=0V, VCB=VDD/2 and VIN=VSS=0V.

In the inverter shown in FIG. 8, since the voltage VIN is set such that VIN=0V, the PMOS (PM1) assumes an ON state and the NMOS (NM1) assumes an OFF state whereby the voltage VOUT is set such that VOUT (VOUT=VDD).

Accordingly, the voltage VDD (VDD−0=VDD) is applied between the source and the drain as well as between the gate and the drain of the NOMS (NM1) and hence, it is highly possible that the transistor assumes a deteriorated state depending on the voltage VDD (VDD−0).

On the other hand, in the inverter shown in FIG. 2, PMOS (PM1) and the PMOS (PM2) assume an ON state and the NMOS (NM1) and the NMOS (NM2) assume an OFF state and hence, the voltage VOUT is set such that VOUT=VDD.

However, since the gate voltage of the NMOS (NM2) is VDD/2, assuming a threshold voltage of the NMOS (NM2) as (Vth), the source voltage of the NMOS (NM2) (that is, the drain voltage of NMOS (NM1)) becomes VDD/2−Vth.

Accordingly, the voltage between the source and the drain as well as the voltage between the gate and the drain of the NMOS (NM1) become VDD/2−Vth and hence, it is possible to provide the circuit configuration with the high drain-source breakdown voltage (BVds) proof property.

In the same manner, the voltage between the source and the drain of the NMOS (NM2) is set such that VDD/2+Vth ({VDD −(VDD/2−Vth)}=VDD/2+Vth) and the voltage between the gate and the drain of the NMOS (NM2) is set such that VDD/2 (VDD−VDD/2=VDD/2). Accordingly, it is possible to provide the operation with the high drain voltage tolerance against the usual inverter constitution. Accordingly, even when a transistor with the same voltage dielectric resistance is applied, it is possible to cope with the much higher voltage.

Further, in FIG. 2, assuming the voltages VSS, VCB and VIN as VSS=0V, VCB=VDD/2 and VIN=VDD, in the inverter shown in FIG. 2, the PMOS (PM1) and the PMOS (PM2) assume an OFF state and the NMOS (NM1) and NMOS (NM2) assume an ON state and hence, the voltage VOUT is set such that VOUT=0V.

Further, since the gate voltage of the PMOS (PM2) is VDD/2, assuming the threshold voltage of the PMOS (PM2) as (Vth), the source voltage of the PMOS (PM2) (that is, the drain voltage of PMOS (PM1)) becomes VDD/2+Vth.

Accordingly, the voltage between the source and the drain and the voltage between the gate and the drain of the PMOS (PM1) become {VDD−(VDD/2+Vth)}=VDD/2−Vth and the voltage between the source and the drain of the PMOS (PM2) becomes VDD/2+Vth and hence, the voltage between the gate and the drain becomes (VDD/2−0)=VDD/2.

In this case, as shown in FIG. 1, by allowing the gate voltages of the NMOS (NM2) and the PMOS (PM2) to be set independently from each other, it becomes possible to provide the more precise processing.

Figure 3:
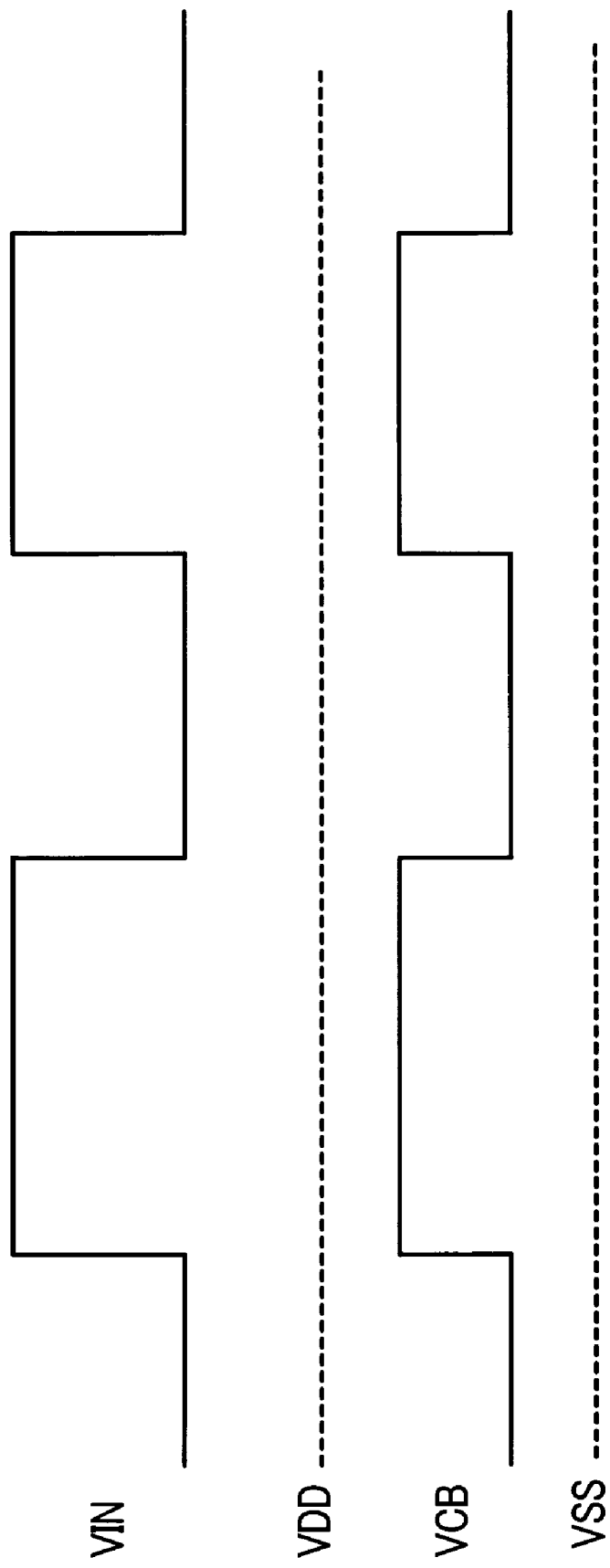
FIG. 3 is a circuit diagram showing another example of a bias voltage applying method in the CMOS inverter shown in FIG. 1.

Still further, as shown in FIG. 3, by forming the fixed bias voltage (VCB) into a pulse in response to a High level (H-level, hereinafter) or a Low level (L-level, hereinafter) of a signal inputted to an input terminal (VIN), it is possible to achieve both of the high breakdown voltage proof property and the high-speed operation.

For example, in FIG. 2 and FIG. 3, assuming the voltages VIN and VOUT as VIN=0V and VOUT=VDD, since the NMOS (NM1) is in an OFF state, by applying a bias voltage VCB which satisfies the relationship VSS<VCB<VDD to the gate of the NMOS (NM2), the deterioration of the NMOS (NM1) can be prevented.

However, when the voltages VIN, VOUT are changed over to VIN=VDD and VOUT=0V, the NMOS (NM1) becomes an ON state and hence, the voltage VOUT is discharged from VDD to 0V. In this case, by applying the higher voltage to the gate of the NMOS (NM2), the discharge can be performed rapidly.

Accordingly, when the NMOS (NM1) assumes an ON state, by setting a value of the bias voltage VCB of the NMOS (NM2) higher than a value of the voltage VCB when the NMOS (NM1) is in the OFF state, the high-speed operation becomes possible.

With respect to the PMOS (PM1) and the PMOS (PM2), the operation is performed in the manner opposite to the case in which the NMOS (NM1) and the NMOS (NM2) are operated. That is, when the PMOS (PM1) assumes an ON state, by setting a value of the bias voltage VCB of the PMOS (PM2) lower than a value of the bias voltage VCB when the PMOS (PM1 is in the OFF state, the high-speed operation can be realized.

Accordingly, as shown in FIG. 3, in synchronism with the change of the ON state or the OFF state of the NMOS (NM1) and the PMOS (PM1) (that is, the change of a level of a signal inputted to the input terminal (VIN)), the bias voltage (VCB) is pulsed and a magnitude of the voltage is varied.

For example, the VCB can be changed as the combination of VDD/3 and 2VDD/3 or as the combination of VDD/4 and 3VDD/4.

Here, the numerical values of the VDD/4 and the like are not always necessary to be a strict value and may be changed within a range of allowance of ±10%. The numerical values may be changed in the same manner with respect to the case shown in FIG. 1.

For example, when the PMOS (PM1) assumes the OFF state, the bias voltage VCBP is set to VDD/2 (or a voltage higher than VDD/2), while when the PMOS (PM1) assumes the ON state, the bias voltage VCBP is set to a voltage lower than the value when the PMOS (PM1) assumes the OFF state, for example, VDD/3 or VDD/4.

In the same manner, when the NMOS (NM1) assumes the OFF state, the bias voltage VCBN is set to VDD/2 (or a voltage lower than VDD/2), while when the NMOS (NM1) assumes the ON state, the bias voltage VCBN is set to a voltage higher than the value when the NMOS (NM1) assumes the OFF state, for example, 2VDD/3 or 3VDD/4.

Here, the specific numerical values explained here may be changed within a range of allowance of ±10%.

Figure 4:
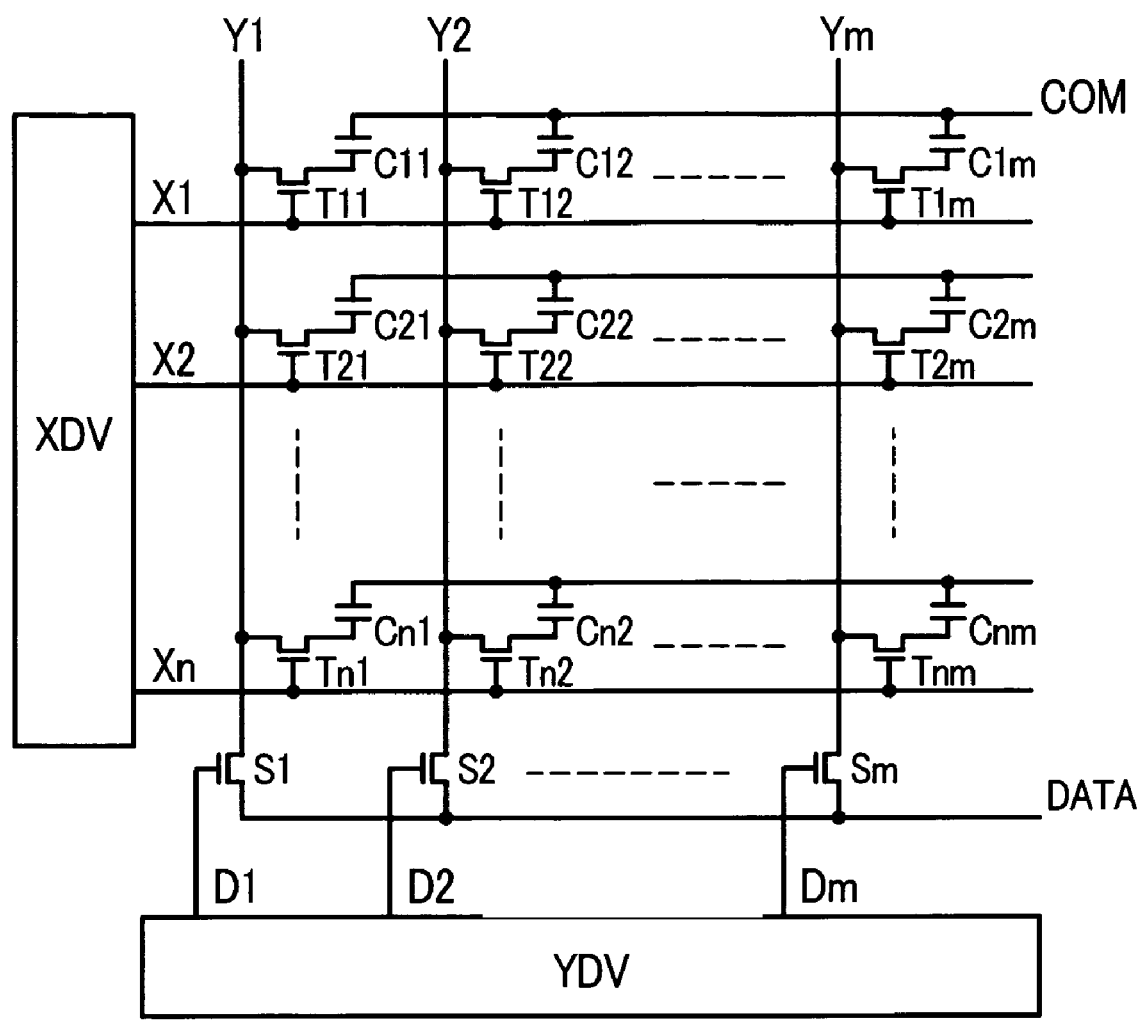
FIG. 4 is a circuit diagram showing an equivalent circuit of an active matrix type liquid crystal display device of an embodiment of the present invention.

FIG. 4 is a circuit diagram showing an equivalent circuit of the active matrix type liquid crystal display device of this embodiment.

As shown in FIG. 4, the active matrix type liquid crystal display device of the embodiment of the present invention includes, on a liquid-crystal-side surface of one substrate of a pair of substrates which are arranged to face close each other with liquid crystal therebetween, n pieces of gate lines (X1, X2, ... Xn) which are arranged in parallel in the y direction and extend in the x direction and m pieces of drain lines (Y1, Y2, ... Ym) which are arranged in parallel in the x direction and extend in the y direction.

Regions which are surrounded by the gate lines (also referred to as scanning lines) and drain lines (also referred to as video lines) constitute pixel regions, wherein each pixel region is provided with a thin film transistor (Tnm) which has a gate thereof connected to the gate line, a drain (or a source) thereof connected to the drain line and a source (or a drain) thereof connected to a pixel electrode. Further, a holding capacitance (Cnm) is provided between the pixel electrode and a common electrode (COM).

The respective gate lines (X1, X2, ... Xn) are connected to a scanning signal drive circuit (XDV) and the scanning signal drive circuit (XDV) sequentially supplies the gate signal from the gate lines X1 to Xn or from the gate lines Xn to X1.

The respective drain lines (Y1, Y2, ... Ym) are connected with drains (or sources) of the switching elements (S1, S2, ... Sm).

The switching elements (S1, S2, ... Sm) have sources (or drains) thereof connected to a video signal line (DATA), while gates thereof connected to a video signal drive circuit (YDV).

Scanning is sequentially performed by the video signal drive circuit (YDV) from the switching element S1 to the switching element Sm or from the switching element Sm to the switching element S1.

In this embodiment, with respect to thin film transistors used in the scanning signal drive circuit (XDV) and the video signal drive circuit (YDV), a semiconductor layer is formed of poly-crystalline silicon (polysilicon) and the thin film transistors are formed on one substrate surface using the same step as the thin film transistors which constitute the active elements.

Further, the scanning signal drive circuit (XDV) and the video signal drive circuit (YDV) include the CMOS circuits shown in FIG. 1 and FIG. 2.

Here, the explanation has been made with respect to the case in which the present invention is applied to the CMOS circuit in the above-mentioned explanation. However, the present invention is also applicable to a circuit which is formed of only the NMOS or the PMOS.

Hereinafter, an embodiment in which the present invention is applied to a NMOS type single-channel circuit shift register is explained.

Figure 5:
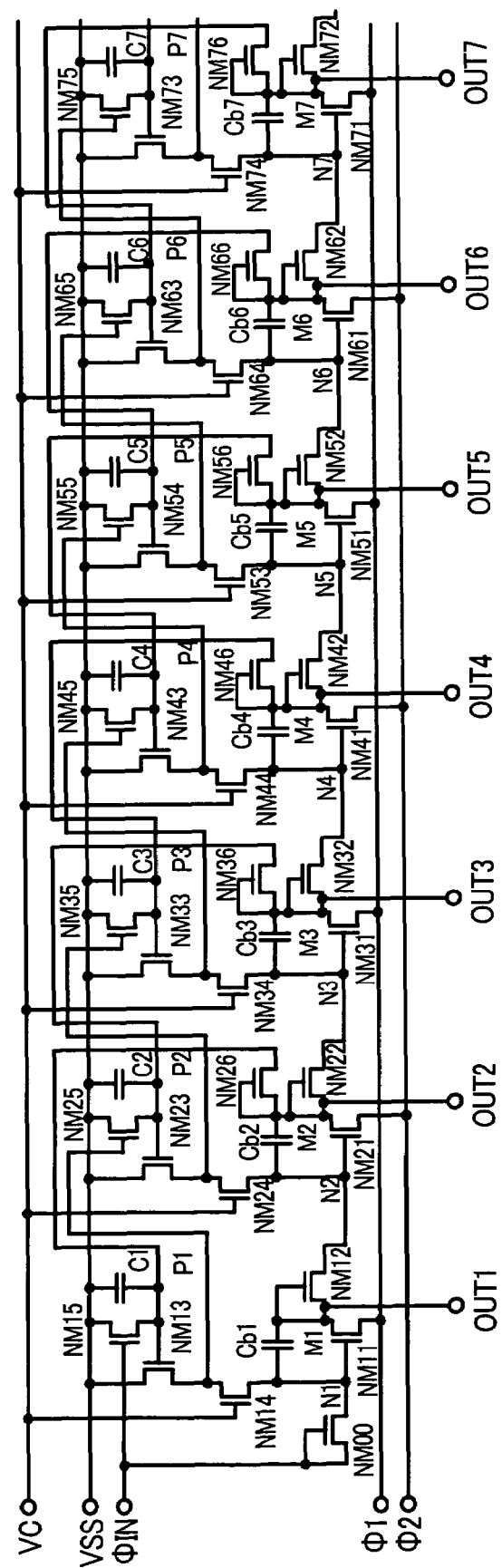
FIG. 5 is a circuit diagram showing a shift register which is applied to the active matrix type liquid crystal display device of the embodiment of the present invention.

FIG. 5 is a circuit diagram showing the single-channel shift register which is applicable to the active-matrix type liquid crystal display device of this embodiment of the present invention.

The shift register shown in FIG. 5 is constituted of n pieces of basic circuits which are longitudinally connected with each other.

Each basic circuit includes a first NMOS (NMn1) and a shift output of a preceding stage is applied to a gate of the NMOS (NMn1). Here, to a gate of the first-stage NMOS (NM11), for example, an input pulse (φIN) having an amplitude Vφ (also referred to as a start pulse) is applied. This first NMOS (NMn1) is a setting transistor (or a drive transistor).

Sources of odd-numbered NMOS among the first NMOS (NMn1) are connected to a first clock signal line to which a clock signal (φ1) is supplied, while sources of even-numbered NMOS among the first NMOS (NMn1) are connected to a second clock signal line to which a clock signal (φ2) is supplied.

Here, the clock signal (φ1) and the clock signal (φ2) have phases opposite to each other, wherein the clock signals are signals which have the opposite phases while having the same cycle. Here, the amplitude of the clock signals (φ1, φ2) is set to Vφ.

Drains of the NMOS (NMn1) are connected to the external output terminals (OUTn) of respective basic circuits. This also provides the shift outputs of respective stages. Further, the diode-connected second NMOS (NMn2) is connected to the drain of the NMOS (MNn1) and this output of the NMOS (NMn2) is outputted to the next stage.

A capacitive element (Cbn) is connected between the drain and the gate of the first NMOS (NMn1). This capacitive element (Cbn) operates as a bootstrap capacitance.

Between a node (Nn) and a power source line to which a power source voltage VSS is supplied, the third NMOS (NMn3) and the fourth NMOS (NMn4) are connected in series. A fixed bias voltage VC is applied to the gate of the NMOS (NMn4). The VSS is 0V, for example.

The shift output of the subsequent stage is applied to the gate of the NMOS (NMn3) via the diode. To be more specific, in the basic circuits of the second and succeeding stages, the shift output of each stage is applied to the gate of the NMOS (NMn3) of the preceding stage by way of the diode-connected sixth NMOS (NMn6) which is connected to the drain of the NMOS (NMn1). Accordingly, the NMOS (NMn3) functions as a transistor for resetting.

The fifth NMOS (NMn5) and the capacitive element (Cn) are connected between the gate of the NMOS (NMn3) and the power source line to which the power source voltage of VSS is supplied, and the drain voltage of the third NMOS (NMn3) of the preceding stage is applied to the gate of the NMOS (NMn5).

On the other hand, an input pulse (φIN) is applied to the gate of the NMOS (NM15) of the first column.

Hereinafter, the operation of the shift register shown in FIG. 5 is explained using a timing chart shown in FIG. 6.

When the clock (φ1) is changed from the H-level to the L-level and the clock (φ2) is changed from the L-level to the H-level at a point of time t1, the input pulse (φIN) is changed from the L-level to the H-level between a point of time t0 and the point of time t1 and hence, the NMOS (NM15) assumes an ON state and a voltage (VP1) of a node (P1) assumes an L-level whereby the NMOS (NM13) assumes an OFF state and a node (N1) assumes a floating state.

Simultaneously, due to the NMOS (NM00) which is connected in the diode connection, a voltage (VN1) of the node (N1) assumes the H-level (strictly speaking VN1=Vφ−Vth).

By setting the relationship between the VN1 and the Vth as VN1 (=Vφ−Vth)>Vth (NMOS (NM11)), the NMOS (NM11) also assumes an ON state.

Further, by setting the relationship between the VN1 and the Vth as VN1 (=Vφ−Vth)>Vth (NMOS (NM25)), the NMOS (NM25) assumes an ON state and the voltage (VP2) of the node (P2) assumes the L-level and hence, the NMOS (NM23) assumes an OFF state and the node (N2) assumes a floating state.

At this point of time, out of the NMOS (NMn1) to which the clock signals (φ1, φ2) are applied, only the gates of the NMOS (NM11) and the NMOS (NM21) assume a floating state.

At a point of time t2, the clock (φ1) is changed from the L-level to the H-level and the clock (φ2) is changed from the H-level to the L-level.

At this time, since the NMOS (NM11) assumes an ON state, the voltage of the node (M1) is boosted and, due to the bootstrap effect of the capacitive element (Cb1), the voltage (VM1) of the node (M1) assumes Vφ.

At this time, although, in the node (N1), by boosting the voltage thereof, the voltage (VN1) is boosted until the relationship VN1=(Vφ−Vth)+Vφ(Cb/(Cb+Cs)) is established, the input pulse (φIN) assumes the H-level and the gate of the NMOS (NM13) assumes VSS (=GND) and hence, the NMOS (NM13) is forcibly held in an OFF state.

Here, Cb indicates a capacitance (bootstrap capacitance) of the capacitive element (Cb1) and Cs indicates a capacitance obtained by subtracting the bootstrap capacitance (Cb) from the whole capacitance of the node (N1) and is a so-called parasitic capacitance.

Here, due to the NMOS (NM12) which is connected in the diode connection, the voltage (VN2) of the node (N2) assumes the relationship of VN2=Vφ−Vth.

Accordingly, since the NMOS (NM21) in which the voltage of the VN2 is applied to the gate thereof assumes an ON state and, at the same time, the NMOS (NM35) in which the voltage of the VN2 is applied to the gate thereof assumes an ON state, the voltage (VP3) of the node (P3) assumes the L-level and hence, the NMOS (NM33) assumes an OFF state whereby the node (N3) assumes a floating state.

At a point of time t3, the clock (φ1) is changed from the H-level to the L-level and the clock (φ2) is changed from the L-level to the H-level.

When the clock (φ1) is changed from the H-level to the L-level, although the voltage (VM1) of the node (M1) assumes the L-level, the node (N2) is held in the H-level.

Further, due to the change of the clock (φ2) from the L-level to the H-level, the voltage (VM2) of the node (M2) assumes Vφ via the NMOS (NM21) which is held in an ON state.

Accordingly, due to the NMOS (NM22) which is connected in the diode connection, the voltage (VN3) of the node (N3) assumes the relationship VN3=Vφ−Vth, the NMOS (NM31) in which the voltage of the VN3 is applied to the gate thereof assumes an ON state and, at the same time, the NMOS (NM45) in which the voltage of the VN3 is applied to the gate thereof assumes an ON state and hence, the voltage (VP4) of the node (P4) assumes the L-level whereby the NMOS (NM43) assumes an OFF state and the node (N4) assumes a floating state.

Simultaneously, due to the NMOS (NM26) which is connected in the diode connection, the voltage (VP1) of the node (P1) assumes the relationship VP1=Vφ−Vth and hence, the NMOS (NM13) in which the voltage VP1 is applied to the gate thereof assumes an ON state.

Accordingly, the voltage (VN1) of the node (N1) assumes the voltage VSS and hence, the NMOS (NM11) is forced to assume an OFF state.

Since the voltage (VP1) of the node (P1) is held by the capacitive element (C1), even when the voltage (VN2) of the node (N2) assumes the L-level thereafter, and the node (P1) is held at the H-level.

That is, the voltage VSS is applied to the gate of the NMOS (NM11) until the input pulse (φIN) assumes the H-level again, the NMOS (NM11) is held in an OFF state.

Here, the capacitive element (C1) can be substituted by the parasite capacitance.

At a point of time t4, the clock (φ1) is changed from the L-level to the H-level and the clock (φ2) is changed from the H-level to the L-level.

Due to the change of the clock (φ2) from the H-level to the L-level, the voltage (VM2) of the node (M2) assumes the L-level. However, the node (N3) is held in the H-level.

Since the clock (φ1) assumes the H-level, the voltage (VM3) of the node (M3) assumes Vφ via the NMOS (NM31) which is held in an ON state and hence, due to the NMOS (NM32) which is connected in the diode connection, the voltage (VN4) of the node (N4) assumes the relationship VN4=Vφ−Vth.

Accordingly, the NMOS (NM41) in which the voltage VN4 is applied to the gate thereof assumes an ON state and, at the same time, the NMOS (NM55) in which the voltage VN4 is applied to the gate thereof assumes an ON state and hence, the voltage (VP5) of the node (P5) assumes an L-level whereby the NMOS (NM53) assumes an OFF state and the node (N5) assumes a floating state.

Simultaneously, due to the NMOS (NM36) which is connected in the diode connection, the voltage (VP2) of the node (P2) assumes the relationship of VP2=Vφ−Vth and hence, the NMOS (NM23) in which the voltage VP2 is applied to the gate thereof assumes an ON state.

Accordingly, the voltage (VN2) of the node (N2) assumes the voltage VSS and hence, the NMOS (NM21) is forced to assume an OFF state.

Since the voltage VP2 of the node (P2) is held by the capacitive element (C2), even when the voltage (VN3) of the node (N3) assumes the L-level thereinafter, the node (P2) is held in the H-level.

That is, since the voltage of VSS is applied to the gate of the NMOS (NM21) until the node (N1) assumes the H-level again, the NMOS (NM21) is held in an OFF state.

Thereafter, the shift registers are operated sequentially while repeating the above-mentioned operation.

In this embodiment, in respective basic circuits, the third NMOS (NMn3) and the fourth NMOS (NMn4) are connected in series between the node (Nn) and the power source line to which the power source voltage VSS is applied.

Here, to the gate of the NMOS (NMn4), the fixed bias voltage VC is applied.

Accordingly, in the case that the NMOS (NMn4) is not provided, for example, when the clock (φ1) is changed from the L-level to the H-level at a point of time t2 and the voltage (VN1) of the node (N1) is boosted to assume the relationship VN1=(Vφ−Vth)+Vφ(Cb/(Cb+Cs)), the drain voltage of the NMOS (NMn3) becomes equal to or higher than Vφ and hence, the constitution becomes disadvantageous in view of the drain-source breakdown voltage (BVds) proof property.

However, in this embodiment, by providing the NMOS (NMn4) and by applying the fixed bias voltage VC to the gate of the NMOS (NMn4), for example, it is possible to set the drain voltage of the NMOS (NMn3) equal to or lower than the bias voltage of VC (VC−Vth).

As a result, it is possible to enhance the proof property of the whole circuit against drain-source breakdown voltage (BVds). In the same manner, with respect to the NMOS (NMn5), it is possible to enhance the drain-source breakdown voltage (BVds) proof property.

Here, assuming the maximum voltage VN(max) which is generated on the node (Nn) is as VN(max)=(Vφ−Vth)+Vφ(Cb/(Cb+Cs)), the bias voltage VC is set lower than the voltage VN(max) and is set higher than the voltage VSS {that is, VSS<VC<VN(max)}, For example, the voltage VC is set such that VC=Vφ.

Further, by including an error of ±10% as an allowance, the voltage VC may be set to satisfy the relationship 0.9×Vφ≦VC≦1.1×Vφ. Further, the voltage VC may be set to satisfy the relationship 0.9×(VN(max)−VSS)/2≦VC≦1.1×(VN(max)−VSS)/2.

Here, it is possible to operably use the bias voltage VC in a form of pulses so that the operation can be improved such that the operation can be performed more finely.

Figure 7:
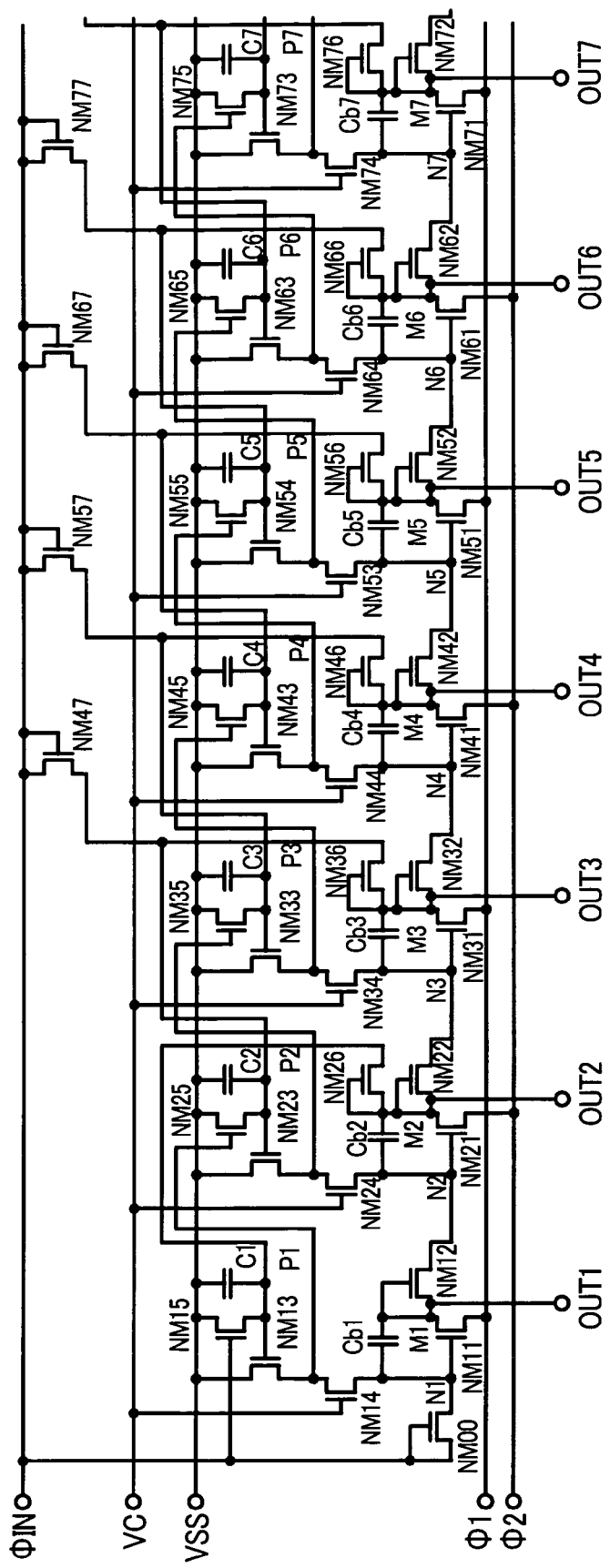
FIG. 7 is a circuit diagram showing a modification of the shift register shown in FIG. 5.

FIG. 7 is a circuit diagram showing a modification of the shift register shown in FIG. 5.

The shift register shown in FIG. 7 is characterized in that, in the shift register shown in FIG. 5, the input pulse signal (φIN) is applied to the nodes (P2, P3, P4, P5 . . . ) via the NMOS (NM47, NM57, NM67, NM77 . . . ) which are connected in the diode connection.

These NMOS (NM47, NM57, NM67, NM77 . . . ) can reinforce again the H-level of the nodes (P2, P3, P4, P5 . . . ) which are in a floating state when the input pulse signal (φIN) assumes the H-level whereby it is possible to more reliably hold the non-selected input gate in the forced OFF state.

Further, in starting the scanning which comes immediately after supplying the power source, it is possible to obtain an advantageous effect that the initialization which is as same as the initialization performed in the normal operating state can be performed.

Figure 6:
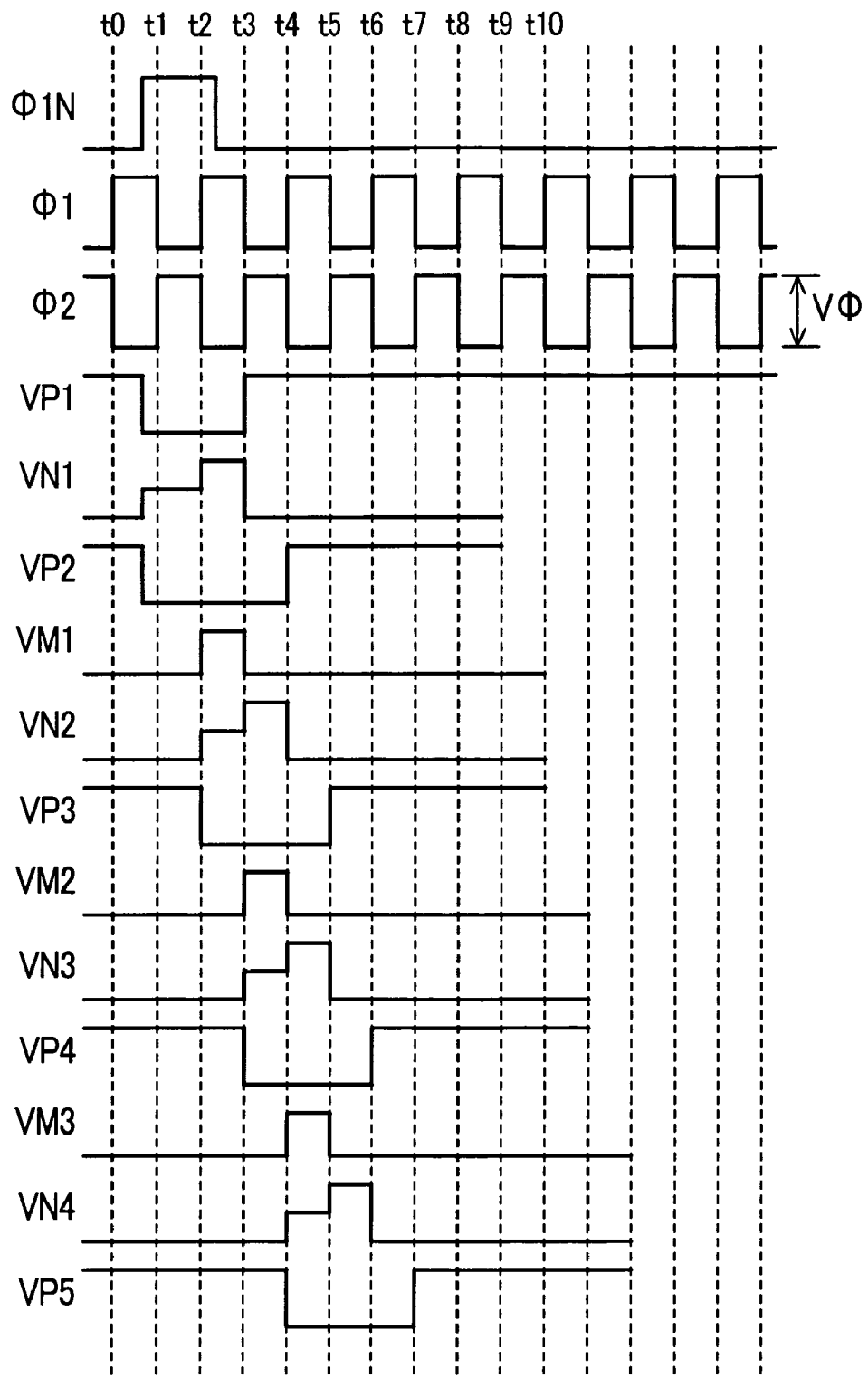
FIG. 6 is a timing chart of the shift register shown in FIG. 5.

The shift register explained in conjunction with FIG. 5 to FIG. 7 can be used as a shift register in the scanning signal drive circuit XDV shown in FIG. 4. In this case, the signals which are outputted to the external output terminals (OUT1 to OUTn) can be used as scanning signals which are applied to the gate lines (X1 to Xn).

Further, by setting the number of the steps of the basic circuit as m steps, the basic circuit can be used as the shift register in the video signal drive circuit YDV in FIG. 4. In this case, the signal which is outputted to the external output terminals (OUT1 to OUTn) can be used as signals (D1 to Dm) which are applied to the gates of the switching elements (S1 to Sm).

Here, the number of the steps of the basic circuits is not limited to n steps or m steps. That is, the number of the steps may be further increased and one or more number of basic circuits in the beginning step or in the final step may be used as dummy circuits.

Here, in the above-mentioned embodiment, the explanation has been made with respect to the case in which the n-type transistor is used as the thin film transistor which constitutes the shift register. However, by reversing the absolute potentials of the H-level and the L-level of respective signals, it is possible to use a p-type transistor as the thin film transistor which constitutes the shift register.

Further, in the above-mentioned embodiment, the explanation has been made with respect to the case in which the thin film transistor is constituted of the MOS transistor which includes the gate insulation film made of $SiO_2$, for example. However, it is needless to say that gate insulation film may be made of SiN, for example.

Further, in the above-mentioned embodiment, the explanation has been made with respect to the case in which the shift register is used in the liquid crystal display device. However, it is needless to say that the present invention is not limited to such a case and is applicable to the shift register which is used in other display device such as an EL display device or the like.

Although the invention made by inventors of the present invention has been specifically explained heretofore in conjunction with the above-mentioned embodiments, the present invention is not limited to the above-mentioned embodiments and various modifications are considered without departing from the gist of the present invention.

What is claimed is:

1. A display device comprising:
  a plurality of pixels; and
  a drive circuit which drives the plurality of pixels,
  wherein the drive circuit includes:
  a first transistor which has a first electrode thereof connected to a power source line to which a reference voltage V1 is applied; and
  a second transistor which has a first electrode thereof connected to a second electrode of the first transistor and allows a bias voltage Vc to be applied to a control electrode thereof, wherein when the first transistor assumes an OFF state, assuming a voltage applied to a second electrode of the second transistor as V2, a relationship V2<Vc<V1 is satisfied, and
  wherein the relationship 0.9×(V1−V2)/2≦Vc≦1.1×(V1−V2)/2 is established.

2. A display device comprising:
  a plurality of pixels; and
  a drive circuit which drives the plurality of pixels,
  wherein the drive circuit includes:
  a first transistor which has a first electrode thereof connected to a power source line to which a reference voltage V1 is applied; and
  a second transistor which has a first electrode thereof connected to a second electrode of the first transistor and allows a bias voltage Vc to be applied to a control electrode thereof, wherein when the first transistor assumes an OFF state, assuming a voltage applied to a second electrode of the second transistor as V2, a relationship V1<Vc<V2 is satisfied, and wherein the relationship $0.9 \times (V2-V1)/2 \leq Vc \leq 1.1 \times (V2-V1)/2$ is established.

3. A display device comprising:

a plurality of pixels; and a drive circuit which drives the plurality of pixels, wherein the drive circuit includes:

a first-conductive-type first transistor which has a first electrode thereof connected to a first power source line to which a reference voltage V1 is applied;

a first-conductive-type second transistor which has a first electrode thereof connected to a second electrode of the first transistor and a second electrode thereof connected to an output terminal thereof, a second-conductive-type third transistor which has a first electrode thereof connected to a second power source line to which a reference voltage V2 is applied; and a second-conductive-type fourth transistor which has a first electrode thereof connected to a second electrode of the third transistor and a second electrode thereof connected to an output terminal thereof, wherein a first bias voltage Vcp is applied to a control electrode of the second transistor, a second bias voltage Vcn is applied to a control electrode of the fourth transistor, a relationship V2<Vcp<V1 and a relationship V2<Vcn<V1 are satisfied, and the relationship $0.9 \times (V1-V2)/2 \leq Vcp \leq 1.1 \times (V1-V2)/2$ and the relationship $0.9 \times (V1-V2)/2 \leq Vcn \leq 1.1 \times (V1-V2)/2$ are established.

4. A display device according to claim 3, wherein the control electrode of the second transistor and the control electrode of the fourth transistor are connected to a bias power source line, and in conformity with an OFF state of the first transistor or the third transistor, the first bias voltage Vcp or the second bias voltage Vcn is applied to the bias power source line.

5. A display device comprising:

a plurality of pixels; and a drive circuit which drives the plurality of pixels, wherein the drive circuit includes a single channel shift register, the single channel shift register includes n pieces (n≧2) of basic circuits which are connected in multiple stages, each basic circuit includes a first transistor which has a first electrode thereof connected to a power source line to which a reference voltage V1 is applied; and a second transistor which has a first electrode thereof connected to a second electrode of the first transistor and a allows a bias voltage Vc to be applied to a control electrode thereof, when the first transistor assumes an OFF state, assuming a maximum voltage applied to a second electrode of the second transistor as V2, a relationship V1<Vc<V2 is satisfied, and wherein the relationship $0.9 \times (V2-V1)/2 \leq Vc \leq 1.1 \times (V2-V1)/2$ is Established.

6. A display device according to claim 5, wherein each basic circuit includes:

a setting transistor which has a control electrode thereof connected to a second electrode of the second transistor; and a capacitive element which is connected between a second electrode and the control electrode of the setting transistor, wherein shift outputs of respective stages are outputted from the second electrode of the setting transistor, the first electrode of the setting transistor of the odd-numbered basic circuit is connected to a first clock signal line to which a first clock is applied, the first electrode of the setting transistor of the even-numbered basic circuit is connected to a second clock signal line to which a second clock is applied, the first clock and the second clock have the same cycle and differ in phase from each other, and an input pulse or a shift output of a preceding stage is applied to a node of the control electrode of the setting transistor and the second electrode of the second transistor by way of a diode.

7. A display device according to claim 6, wherein a shift output of the basic circuit of a succeeding stage is applied to the control electrode of the first transistor by way of a second diode.

8. A display device according to claim 7, wherein the display device includes a third transistor which is connected between the first electrode and the control electrode of the first transistor, and an input pulse or a voltage of a node between a second electrode of the first transistor of the preceding stage and the first electrode of the second transistor is applied to a control electrode of the third transistor.

9. A display device according to claim 6, wherein assuming an amplitude of the first clock and the second clock as Vφ, a relationship $0.9 \times V\phi \leq Vc \leq 1.1 \times V\phi$ is satisfied.

* * * * *